United States Patent [19]

Cline et al.

[11] 4,006,040

[45] Feb. 1, 1977

[54] SEMICONDUCTOR DEVICE MANUFACTURE

[75] Inventors: Harvey E. Cline; Thomas R. Anthony, both of Schenectady; Mike F. Chang, Liverpool, all of N.Y.

[73] Assignee: General Electric Company, Schenectady, N.Y.

[22] Filed: Dec. 31, 1975

[21] Appl. No.: 645,672

[52] U.S. Cl. .................. 148/1.5; 148/171; 148/172; 148/177; 148/179; 148/186; 148/187; 148/188; 357/48

[51] Int. Cl.² ....................... H01L 21/225

[58] Field of Search .......... 148/1.5, 171, 172, 177, 148/179, 186, 187, 188; 252/62.3 GA, 62.3 E; 357/48

[56] References Cited

UNITED STATES PATENTS

| | | | |
|---|---|---|---|
| 2,813,048 | 11/1957 | Pfann | 148/1 |
| 3,897,277 | 7/1975 | Blumenfeld | 148/1.5 |
| 3,898,106 | 8/1975 | Cline et al. | 148/1.5 |
| 3,899,361 | 8/1975 | Cline et al. | 148/1.5 |
| 3,899,362 | 8/1975 | Cline et al. | 148/1.5 |
| 3,901,736 | 8/1975 | Anthony et al. | 148/1.5 |
| 3,902,925 | 9/1975 | Anthony et al. | 148/1.5 |
| 3,904,442 | 9/1975 | Anthony et al. | 148/1.5 |
| 3,910,801 | 10/1975 | Cline et al. | 148/1.5 |
| 3,936,319 | 2/1976 | Anthony et al. | 148/187 X |
| 3,956,023 | 5/1976 | Cline et al. | 148/1.5 |

*Primary Examiner*—G. Ozaki
*Attorney, Agent, or Firm*—Donald M. Winegar; Joseph T. Cohen; Jerome C. Squillaro

[57] ABSTRACT

An improved method of initiating the moving of a molten zone of a metal-rich semiconductor material through a solid body of the same semiconductor material embodies the sintering of the metal to the surface of the body. The sintering process enables one to migrate two or more intersecting "wires" simultaneously as well as three wires intersecting at a common point of origin.

33 Claims, 8 Drawing Figures

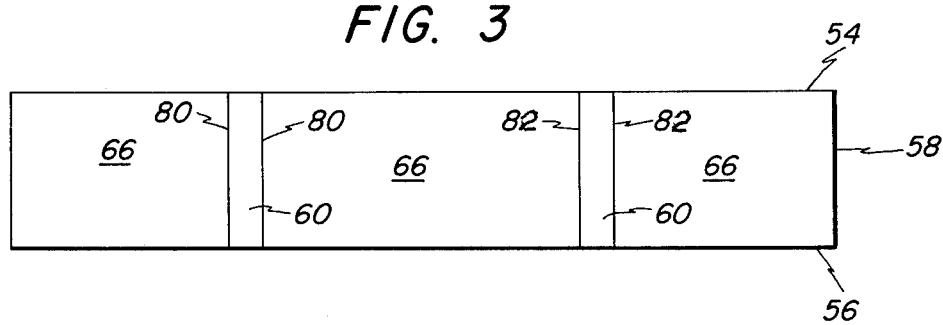
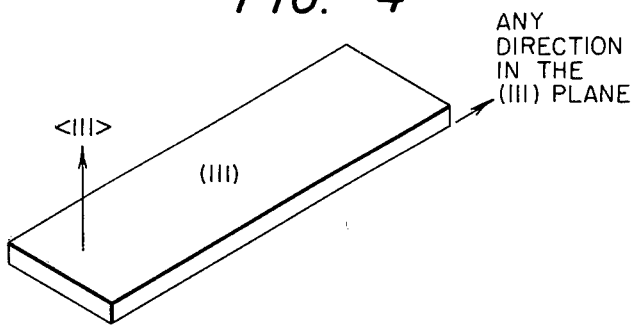
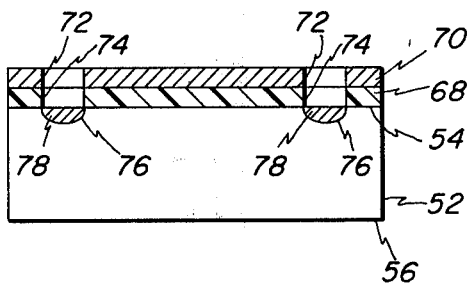
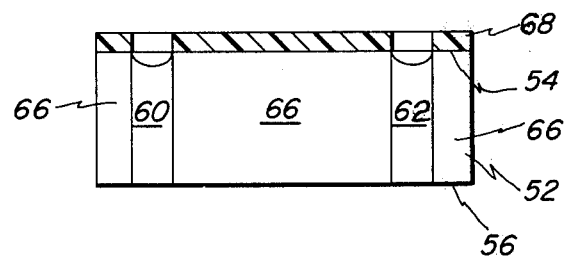
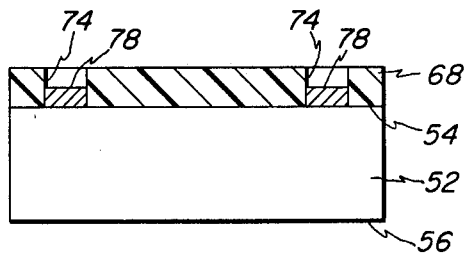
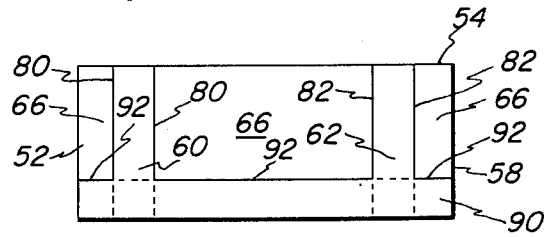

SEMICONDUCTOR DEVICE MANUFACTURE

BACKGROUND OF THE INVENTION

1. Field of the Invention

This invention relates to P-N junction isolation grids for semiconductor devices and method for making the same.

2. Description of the Prior Art

W. G. Pfann describes in "Zone Melting", John Wiley and Sons, Inc., New York (1966), a traveling solvent method to produce a P-N junction within the bulk of a semiconductor. In this method, either sheets or wires of a suitable metallic liquid are moved through a solid semiconductor material by employing a thermal gradient. Doped liquid-epitaxial material is left behind as the liquid wire migration progresses. Pfann also describes his thermal gradient zone melting process and desirable results obtained therefrom in his U.S. Pat. Nos. 2,739,088 and 2,813,048. Until recently, this process of temperature gradient zone melting has been practiced in an attempt to make a variety of semiconductor devices.

In U.S. Pat. No. 3,904,442, issued to Anthony and Cline, two of the inventors of this improved thermal gradient zone melting process, and in their copending application U.S. Ser. No. 519,913, filed on Nov. 1, 1974, there are described novel processing techniques which enable the teachings of W. G. Pfann to be commercially feasible. The improvements taught by Anthony and Cline enabled one to divide a wafer of semiconductor material into a plurality of electrically isolated regions in which electrical devices are manufactured. Further processing results in individual devices when the wafers are "diced" or divided into individual devices.

For example, with reference to FIG. 1, the geometric configuration 10 is produced in a wafer 12 of single crystal semiconductor material by a thermal gradient zone melting process taught by Anthony and Cline. Two or three sequential thermal gradient zone melting processings are required to produce the desired configuration 10. This is accomplished by using preferred wire directions and a (111) planar orientation for the major surface of the wafer of material. The result is three groups of spaced planar regions 14, 16 and 18 of a conductivity type which is opposite to that conductivity type of the wafer 12. P-N junctions 20, 22 and 24 are formed by the abutting surfaces of the material of opposite type conductivity of the body or wafers 12 and the respective planar regions 14, 16 and 18. The planar regions 14, 16 and 18 are oriented at a predetermined angle with respect to each other in order that after migration a first group of hexagonal shape regions 26 and a second group of triangular regions 28 are produced. The regions 26 and 28 are electrically isolated from each other and from mutually adjacent respective regions 26 or 28 by the regions 14, 16 and 18. The regions 28, however, represent a loss of semiconductor material since they are waste when the wafer 12 is separated into individual devices or chips, the functional semiconductor element being fabricated in the region 26.

The regions 28 result from two factors in commercial processing of the wafer or body 12. First, the regions 14, 16 and 18 cannot presently be formed simultaneously by the thermal gradient zone melting process. One must form each region 14, 16 and 18 individually or may form two simultaneously and then form the third region. Therefore, one must rely on at least two, and possibly three, sequences or processing. The reason is explained heretofore in the aforementioned references to Anthony and Cline's patent and patent application. Should one heretofore try to simultaneously migrate three metal wires to form the regions 14, 16 and 18, surface tension, more often than not, causes the metal to "ball up" upon initiation of the formation of the melt to be migrated.

Upon application of heat, the metal melts and begins to alloy with the semiconductor material at the beginning of the migration process. The balling up causes discontinuities in the planar regions 14, 16 and 18, primarily at the intersection thereof, and groups of regions 26 and 28 are not electrically isolated from each other at the end of the process. Therefore, after dicing the wafer into individual electrical devices manufactured in the regions 26 one or more of the separated devices may fail since the portion of the regions 14, 16 and 18 associated therewith, as well as the portion of the corresponding P-N junctions 20, 22, and 24 are relied upon to protect the electrical characteristics of the devices. Additionally, the alignment of masks became a problem also since careless handling and poor alignment of the same during processing may cause loss of product. Therefore, the orientation of the regions as shown, although producing waste semiconductor material, is still desirable in order to try to obtain as high yield of product as possible.

It is therefore an object of this invention to provide a new and improved method of practicing thermal gradient zone melting for producing electrical isolation grids which overcomes the deficiencies of the prior art.

Another object of this invention is to provide a new and improved method for simultaneously migrating three intersecting metal wires as a molten zone of metal-rich semiconductor material through a solid body of the same semiconductor material.

A further object of this invention is to provide an improved thermal gradient zone melting process which maximizes the effective use of the volume of material of a semiconductor wafer.

Other objects of this invention will, in part, be obvious and will, in part, appear hereafter.

BRIEF DESCRIPTION OF THE INVENTION

In accordance with the teachings of this invention, there is provided an improved method for the migration of a molten zone of metal-rich semiconductor material through a solid body of semiconductor material. The method includes the initial process steps of selecting a body of single crystal semiconductor material having a preferred crystallographic structure, two major opposed surfaces, being respectively the top and bottom surfaces thereof, a first predetermined type conductivity and a predetermined level of resistivity. At least the top surface of the body has a preferred planar orientation. The body also has a vertical axis substantially aligned with a first axis of the crystal structure which is also substantially perpendicular to the top surface. A layer of a masking material, such, for example, as one selected from the group consisting of silicon oxide, silicon nitride, aluminum oxide and aluminum nitride is deposited on the top surface of the body. Windows are opened in the layer, preferably by selective chemical etching, to expose the material of a predetermined portion of the top surface of the body therein. A layer of material is deposited in each of the windows and on the exposed surface portion of the body. A portion of the material is then sintered to the material of the top surface of the body. The body, the metal and the sintered material therein is then heated to a predetermined elevated temperature sufficient to form a melt of a metal-rich semiconductor material in the windows. A temperature gradient is established substantially parallel with the vertical axis of the body and the first axis of the crystal structure. The surface on which the melt is formed is maintained at the lower temperature. Thereafter, the melt of metal-rich semiconductor material is migrated as a molten zone through the solid body of semiconductor material. The migration of the melt may be entirely through the body or may be to a predetermined depth within the body. The migration of the melt forms a region of a recrystallized semiconductor material of the body having a solid solubility of the deposited metal therein. The region so produced has a substantially uniform width and a substantially uniform level of resistivity throughout the entire region. Any P-N junction produced is substantially a step junction, but the junction can be graded by a post thermal heat treatment process.

DESCRIPTION OF THE DRAWINGS

FIG. 3 is an elevation view in cross-section of the geometrical arrangement of FIG. 2 taken along the cutting plane 3—3;

FIG. 4 is the morphological shape of wires which migrated stably in the $<111>$ direction;

FIGS. 5, 6, 7 and 8 are side elevation views in cross-section of processing the body of semiconductor material of FIG. 3.

DESCRIPTION OF THE INVENTION

Figure 1:
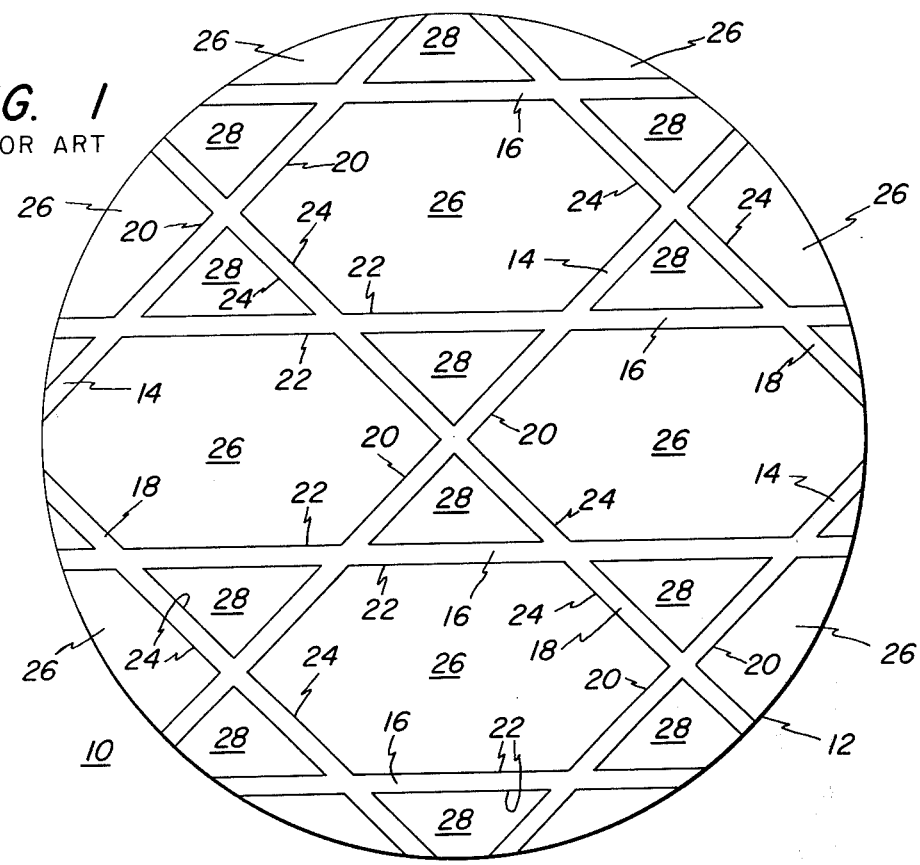
FIG. 1 is a planar view of a geometrical pattern or an arrangement of the prior art.
Figure 2:
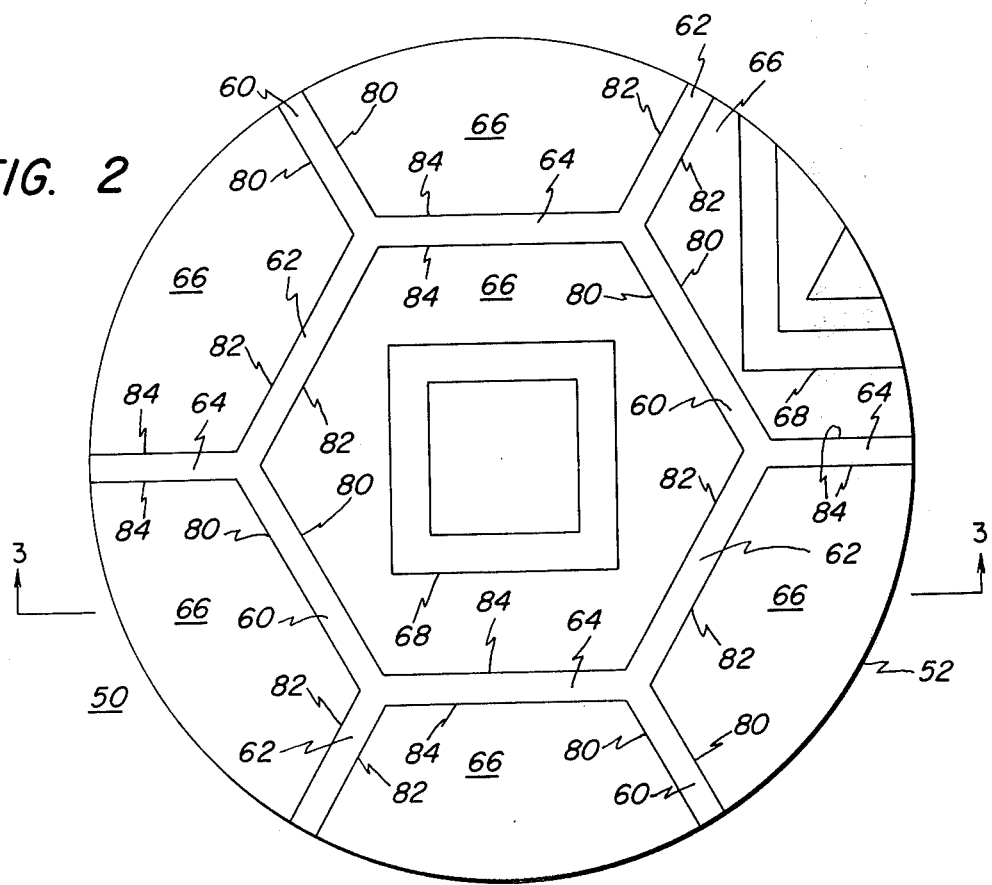
FIG. 2 is a planar view of a geometrical pattern or arrangement embodying the improved process of this invention.

Referring now to FIGS. 2 and 3, there is shown a geometrical pattern or arrangement 50 for electrical isolation regions employed in making a specific class of semiconductor elements commercially. The planar arrangement 50 is, at this time, primarily utilized for processing bodies or wafers 52 of single crystal silicon semiconductor material. However, the material of the wafers or bodies 52 may be germanium, silicon carbide, a compound of a Group II element and a Group VI element and a compound of a Group III element and a Group V element, preferably having a diamond cubic crystal structure. The body 52 has two major surfaces 54 and 56, which define the top and bottom surfaces thereof respectively, and a peripheral side surface 58. In order to describe this invention more fully, the body 52 is said to be of silicon. The thickness of the body is that of a typical wafer of from 6 to 10 mils and greater depending upon the device or devices to be fabricated.

The preferred geometrical arrangement 50 is desirable since it is very easily obtained by the thermal gradient zone melting process and maximizes the volume of semiconductor material available for semiconductor device manufacture and for maximizing the yields obtainable in commercial production.

The geometrical arrangement 50 comprises three groups of spaced planar regions 60, 62 and 64 which extend entirely through and terminate in the opposed major surfaces of, the body or wafer 52. Although the material of the regions 60, 62 and 64 may be of the same type conductivity as that of the body 52, it is preferred that the conductivity type be opposite to that of the material of the wafer 52. This enables one to utilize the regions 60, 62 and 64 as electrical isolation means for dividing the wafer or body 52 into a plurality of regions 66 electrically isolated from each other. Planar or mesa type electrical devices 68 may be fabricated before or after the migration which forms the region 66.

The arrangement 50 may be obtained by employing an improved thermal gradient zone melting process which embodies sintering of the metal wires to help initiate the migration and to produce the regions 60, 62 and 64 in one simultaneous migration.

Referring now to FIG. 4, the wafer or body 52 of single crystal semiconductor material such, for example, as silicon, is selected for its type conductivity and level of resistivity. The level of resistivity of the material of the body 52 varies with the requirement for the desired breakdown voltage of device 68 to be fabricated in the region 66 and that of the P-N junctions of the electrical isolation regions necessary to assure the integrity of the devices 68 when the wafer 56 is diced into individual devices 68. The conductivity type of the planar regions 60, 62 and 64 is determined by the conductivity type required for that of the regions 66 and the wafer 52.

Additionally, the body 52 has a preferred planar crystallographic orientation for at least the surface 54. The preferred orientation is (111). It has been discovered by Cline and Anthony in U.S. Pat. No. 3,904,442, the teachings of which are incorporated herein by reference thereto, that the stability of wires laying in a (111) plane for surface 54 and migrating in a $<111>$ direction through the body 52 to the surface 56 is not generally sensitive to the crystallographic direction of the wire. This general stability of wires lying in the (111) plane results from the fact that the (111) plane is the facet plane for the metal-rich liquid-semiconductor system. The morphological shape of a wire in the (111) plane is shown in FIG. 4 and the top and bottom surfaces are in the (111) plane. Therefore, both the forward and the rear faces of these wires are stable, provided the wire has a width which does not exceed a preferred width of less than 500 microns.

The side faces of a wire lying in the (111) plane are not as equally stable as the top and bottom surfaces. Edges of the side faces lying in $<1\bar{1}0>$, $<10\bar{1}>$ and the $<01\bar{1}>$ directions have (111) type planes as side faces. Consequently, these wires are stable to any sideways drift that may be generated should the thermal gradient be not substantially aligned along the $<111>$ axis. Other wire directions in the (111) plane such, for example, as the $<11\bar{2}>$ type wire directions develop serrations on their side faces if they drift sideways as the result of a slightly off axis thermal gradient. Eventually, the continuing migrating wire breaks up completely or bends into a $<1\bar{1}0>$ type line direction. Therefore, a reasonably well aligned thermal gradient permits thermal migration of $<11\bar{2}>$ type direction wires through at least bodies of semiconductor material one centimeter in thickness by the temperature gradient zone melting process without either breaking up of the wire or serrations of the edges of the migrating wire occurring.

In migrating liquid wires through bodies of semiconductor material having an initial (111) wafer plane, the most stable wire directions are $<01\bar{1}>$, $<10\bar{1}>$, and $<1\bar{1}0>$. The width of each of these wires may be up to approximately 500 microns and still maintain stability during thermal migration. A triangular grid comprising a plurality of wires lying in the three wire directions $<01\bar{1}>$, $<10\bar{1}>$ and $<1\bar{1}0>$ is not readily obtainable by thermal migration embodying the temperature gradient zone melting (TGZM) process of all three wires simultaneously. The surface tension of the melt of metal-rich semiconductor material at the intersection of the three wire directions is sufficient to disrupt the line directions and result in an interruption of the grid structure. The grid heretofore was preferably achieved by three separate TGZM processes embodying liquid wire migration of one wire direction at a time.

Wires of a $<11\bar{2}>$, $<\bar{2}11>$ and $<1\bar{2}1>$ direction are less stable than the $<01\bar{1}>$, $<10\bar{1}>$ and $<1\bar{1}0>$ wire directions during thermal migration but more stable than any other wire directions in the (111) plane. The wires may have a width of up to 500 microns and still maintain their stability during thermal migration.

Any other wire direction in the (111) plane not disclosed heretofore may be migrated through the body of semiconductor material. However, the wires of these wire directions have the least stability of all the wire directions of the (111) plane in the presence of an off axis thermal gradient. Wires of a width up to about 500 microns are stable during migration for all wires lying in the (111) plane regardless of wire direction.

A perpendicular P-N junction isolation grid wherein the regions produced are substantially perpendicular to each other, or of any other configuration of intersecting planar regions, may be fabricated by the simultaneous migration of one of the wire directions $<01\bar{1}>$, $<10\bar{1}>$ and $<1\bar{1}0>$ and one of any of the remaining wire directions. Alternatively, the grid may be produced by migrating each wire direction separately as described heretofore in a referenced previously filed application.

A summation of the stable wire directions for a particular planar direction and the stable wire sizes are tabulated in the Table.

In migrating wires wherein the planar orientation of the surfaced 54 is (111), it is preferred that the surface 54 be preferably etched to form troughlike depressions therein. The trough-like depressions aid initiation of the migration process and prevent the wire members from spreading during the formation of metal-rich semiconductor material wire member. Where wire width precision is not required and some latitude in width can be tolerated, the oxide mask method of our copending patent application Ser. No. 634,247 filed November 21, 1975 incorporated by reference herein, may be practiced. However, one must be aware that some lateral flow of the metal-rich semiconductor material will occur between the mask material and the wafer surface 54 in the immediate vicinity of the window in the mask in which the metal is deposited.

Referring now to FIG. 5, the body or wafer 52 is mechanically polished, chemically etched to remove any damaged surfaces, rinsed in deionized water and dried in air. An acid resistant mask 68 is disposed on the surface 54 of the body 52. Preferably, the mask is of silicon oxide which is either thermally grown or vapor deposited on the surface 14 by any of the methods well known to those skilled in the art. Alternatively, the material of the mask 68 may be of silicon nitride, aluminum nitride or aluminum oxide. Employing well known photolithographical techniques, a layer 70 of a photoresist such as, for example, Kodak Metal Etch Resist, is disposed on the surface of the silicon oxide layer 68. The resist is dried by baking at a temperature of about 80° C. A suitable mask of the configuration 50 of lines of a predetermined thickness, wire direction and intersecting at common points to form the hexagonal array is disposed on the layer 70 of photoresist and exposed to ultraviolet light. After exposure the layer 70 of photoresist is washed in xylene to open windows 72 in the photoresist layer 70 where the lines are desired so as to be able to selectively etch the silicon oxide layer 68 exposed in the windows.

Selective etching of the layer 68 of silicon oxide is accomplished with a buffered hydrofluoric acid solution ($NH_4F$-HF). The etching is continued until windows 74, corresponding to the windows 72 of the photoresist layer 70, are opened in the layer 68 of silicon oxide to expose selective portions of the surface 54 of the body 52 of silicon. The processed body 52 is rinsed in deionized water and dried. The remainder of the photoresist layer 70 is removed by immersion in concentrated sulfuric acid at 180° C or immersion in a solution of 1 part of hydrogen peroxide and 1 part of concentrated sulfuric acid immediately after mixing.

Selective etching of the exposed surface areas of body 52 is accomplished with a mixed acid solution. The mixed acid solution is 10 parts by volume nitric acid, 70%, 4 parts by volume acetic acid, 100%, and 1 part by volume hydrofluoric acid, 48%. At a temperature of from 20° to 30° C, the mixed acid solution selectively etches the silicon of the body 52 at a rate of approximately 5 microns per minute. A trough 76 is etched in the surface 54 of the body 52 beneath each window 74 of the oxide layer 68. The selective etching is continued until the depth of the trough 76 is approximately equal to the width of the window in the silicon oxide layer 68. However, it has been discovered that the trough 76 should be not greater than approximately 100 microns in depth because undercutting of the silicon oxide layer 68 will occur. Undercutting of the layer 68 of silicon oxide has a detrimental effect on the width of the wire to be migrated through the body 52. Etching for approximately 5 minutes at a temperature of 25° C will result in a trough 76 of from 25 to 30 microns in depth for a window width of 10 to 500 microns. The etched body 52 is rinsed in distilled water and blown dry. Preferably, a gas such, for example, as freon, argon and the like is suitable for drying the processed body 52.

The processed body 52 is disposed in a metal evaporation chamber. A layer 78 of a suitable metal is deposited on the remaining portions of the layer 68 of silicon oxide (not shown) and on the exposed silicon in the troughs 76. The metal in the troughs 76 are the metal wires to be migrated through the body 52. The metal of the layer 78 comprises a material, either substantially pure in itself or suitably doped by one or more materials to impart a second and opposite type conductivity to the material of the body 52 through which it migrates. The thickness of the layer 78 is approximately equal to the depth of the trough 76. Therefore, if the trough 76 is 20 microns deep, the layer 78 is approximately 20 microns in thickness.

A suitable material for the metal layer 78 is aluminum to obtain P-type regions in N-type silicon semiconductor material. Prior to migrating the metal wires in the troughs 76 through the body of silicon 52, the excess metal of the layer 78 is removed from the silicon oxide layer 68 by such suitable means as grinding away the excess metal with a 600 grit carbide paper.

It has been discovered that the vapor deposition of the layer 78 of aluminum metal should be performed at a pressure of approximately $1 \times 10^{-5}$ torr but not greater than $5 \times 10^{-5}$ torr. When the pressure is greater than $3 \times 10^{-5}$ torr, we have found that in the case of aluminum metal deposited in the troughs 76, the aluminum does not penetrate into the silicon and migrate through the body 52. It is believed that the layer of aluminum is saturated with oxygen and prevents good wetting of the contiguous surfaces of silicon. The initial melt of aluminum and silicon required for migration is not obtained because of the inability of aluminum atoms to diffuse into the silicon interface. In a like manner, aluminum deposited by sputtering is not desirable as the aluminum appears to be saturated with oxygen from the process. The preferred methods of depositing aluminum on the silicon body 52 are by the electron beam method and the like wherein little, if any, oxygen can be trapped in the aluminum.

Prior to migrating the wire, the processed body 52 is placed in a suitable furnace and heated to a temperature of from 500° C for a period of time from 5 to 30 minutes to sinter the metal wire to the semiconductor material of the trough-like depressions. A preferred sintering temperature is 525° C ± 5° C for a period of time of about 20 minutes. The process produces incipient fusion of a portion of the metal to the semiconductor material of the surface with which the metal is in contact.

This sintering process step is a necessity to migrate all the wires simultaneously. Without sintering, the metal at the intersection of the three different wire directions would, as the result of surface tension, ball up and pull apart. The regions of N-type conductivity in the vicinity of such failure would not be electrically isolated from each other. As a result of sintering, the melt of metal-rich semiconductor material formed at the intersection, as well as elsewhere, remains intact throughout the initiation of migration and during migration through the body 52.

The processed body 52 is placed in a migration apparatus, not shown, and the metal wires in the troughs 76 are migrated through the body 52 by a thermal gradient zone melting process. A thermal gradient of approximately 50° C per centimeter between the bottom surface 56, which is the hot face, and the surface 54 which is the cold face, has been discovered to be appropriate for an average temperature of the body 52 of from 700° C to 135° C. The process is practiced for a sufficient length of time to migrate all the metal wires through the body 10. For example, for aluminum wires of 20 microns thickness, a thermal gradient of 50° C per centimeter, a temperature of the body 10 of 1100° C, a pressure of $1 \times 10^{-5}$ torr, a furnace time of from 5 to 15 minutes is required to migrate the wires through a silicon wafer or body 52 of a standard wafer thickness of about 10 mils.

The general concept of the temperature gradient zone melting process and apparatus is not a part of this invention. For a more thorough understanding of the temperature gradient zone melting process employed in this invention, and for a more thorough description of the apparatus employed for the process, one is directed to the following issued patents by Anthony and Cline, which are incorporated herein by reference thereto, and assigned to the same assignee of this invention: Method of Making Deep Diode Devices, U.S. Pat. No. 3,901,736; High Velocity Thermal Migration Method of Making Deep Diodes, U.S. Pat. No. 3,910,801; Deep Diode Devices and Method and Apparatus, Ser. No. 411,001, now abandoned in favor of a Continuation-In-Part, Ser. No. 552,154 filed February 24, 1975; High Velocity Thermomigration Method of Making Deep Diodes, U.S. Pat. No. 3,898,106; Deep Diode Device and Method, U.S. Pat. No. 3,902,925; and Stabilized Droplet Method of Making Deep Diodes Having Uniform Electrical Properties, U.S. Pat. No. 3,899,361.

Upon completion of the temperature gradient zone melting process, the excess metal of the migrated metal wires is removed from the surface 56 preferably by selective chemical etching. The surfaces 54 and 56 are selectively etched and polished and the resulting processed body 52 is shown in FIGS. 2 and 6.

The thermal migration of the metal wires in the troughs 76 through the body 52 produces a body 52 having three groups of spaced planar regions 60, 62 and 64, each being of a second and opposite type conductivity than that of the body 52. The regions 60, 62 and 64 are so arranged to provide the configuration 50. Each region 60, 62 and 64 is recrystallized material of the body 54 having solid solubility of the metal therein of a level of concentration sufficient to obtain the desired type conductivity and level of resistivity therein. The concentration of the impurity metal is determined by the type of impurity metal moved through the body 52, the semiconductor material, and the temperature at which the thermal gradient zone melting process is practiced. Suitable graphs showing the solid solubility of different impurity metals and various semiconductor materials are well known to those skilled in the art. In particular, one may refer to FIG. 3.7 on Page 45 of the book entitled "Physics and Technology of Semiconductor Devices" by A. S. Groove, to determine the necessary temperature for migrating, or moving a melt of various impurity metals through a solid body of silicon semiconductor material.

The regions 60, 62 and 64 have a substantially constant uniform level of impurity concentration throughout the entire planar region since the temperature gradient range in the body and the slope of the solid solubility of metals employed is such as not to appreciably affect material composition. The thickness of each of the regions 60, 62 and 64 is substantially constant for the entire region. The peripheral surface of each of the planar regions 60, 62, and 64, comprises in part, the top surface 54 and the bottom surface 56.

Additionally, the body 52 is divided into the plurality of spaced regions 66 having the same, or first type conductivity as the body 52. P-N junctions 80, 82 and 84 are formed by the contiguous surfaces of each pair of abutting regions 60 and 66, 62 and 66, 64 and 66, of opposite type conductivity. Each of the P-N junctions 80, 82 and 84 so formed is very abrupt and distinct resulting in a stepped junction. Each of the P-N junctions 80, 82 and 84 is approximately 18 microns in thickness. At a process temperature of 900° C, the profile of each junction 80, 82 and 84 is reduced to approximately 0.3 microns.

The planar regions 60, 62 and 64 may have a resistivity different from that of the body 10. This is achieved by temperature gradient zone melting process wherein the material of the metal layer 78 is suitable for producing regions 60, 62 and 64 of recrystallized material of the body 52 with solid solubility of the metal layer 78 to impart the same N-type conductivity of the body 10 but of a different desired level of resistivity.

Alternately, referring now to FIG. 7, the configuration 50 may be formed wherein the layer 78 of metal comprising the wires to be migrated are sintered to the unetched exposed portions of the surface 54. However, as stated beforehand, one must allow for the lateral flow at the interface between the layer 68 and the surfaces 54 in the immediate vicinity of the window 74.

In the same manner one may employ the novel sintering process to migrate wires intersecting and non-intersecting for planar orientations of the surface 54 of the body or wafer 52 of (100) and (110). The respective stable wire directions are as indicated in the Table. However, it is to be noted the selective etching of the surface 54 is still necessary for migrating metal wires on a surface planar orientation of (110) and having a $<1\bar{1}0>$ wire direction.

Table

| Wafer Plane | Migration Direction | | Stable Wire Directions | Stable Wire Sizes |
|---|---|---|---|---|
| (100) | $<100>$ | | $<011>*$ | $<100$ microns |
| | | | $<0\bar{1}1>*$ | $<100$ microns |
| (110) | $<110>$ | | $<1\bar{1}0>*$ | $<150$ microns |
| (111) | $<111>$ | a) | $<0\bar{1}1>$ | |
| | | | $<\bar{1}01>$ | $<500$ microns |
| | | | $<1\bar{1}0>$ | |
| | + | b) | $<11\bar{2}>*$ | |
| | | | $<\bar{2}11>*$ | $<500$ microns |
| | | | $<1\bar{2}1>*$ | |
| | | c) | Any other direction in (111) plane* | $<500$ microns |

*The stability of the migrating wire is sensitive to the alignment of the thermal gradient with the $<100>$, $<110>$ and $<111>$ axis, respectively.
+Group a is more stable than group b which is more stable than group c.

As a further embodiment of the invention, the regions 66 may also be electrically isolated from the bottom of the body or wafer 52. With reference to FIG. 8, a region 90 of the same type conductivity as that of the regions 60, 62 and 64 is formed in a suitable manner to provide the required electrical isolation. The region 90 may be formed by diffusion of a suitable dopant material through the bottom surface 56 of the body 62, by growing epitaxially a suitable semiconductor material layer to form the region 90, and the like. A P-N junction 92 is formed by the contiguous abutting surfaces of the material of opposite type conductivity of the respective regions and 90. The P-N junction 92 is integral with respective P-N junctions 80 and 82, as shown, as well as P-N junction 84 (FIG. 2) to provide the electrical isolation for each regional cell 66. The region 90 may be formed prior to, or after the migration process.

Although the improved process has been described heretofore in fabricating planar regions, regions of other geometrical configurations may also be fabricated. For example, disc-like shaped metal layers may be deposed on the surface 54. Migration of a melt of such shaped layers will result in columnar regions of recrystallized semiconductor material of the body 52 being formed in situ in the body 52.

We claim as our invention:

1. An improved method for migrating a melt of metal-rich semiconductor material through a solid body of the semiconductor material including the process steps of:
   a. selecting a body of single crystal semiconductor material having two major opposed surfaces comprising the top and bottom surfaces thereof, a predetermined type conductivity, a predetermined level of resistivity, a preferred diamond cubic crystal structure, a preferred planar crystal orientation for at least one of the major surfaces, a vertical axis substantially perpendicular to the opposed major surfaces, and a first preferred crystal axis substantially parallel with the vertical axis and substantially perpendicular to the opposed major surfaces;
   b. vapor depositing a layer of metal on the major surface having a preferred planar crystal orientation, the layer having a preferred width and a preferred thickness and so oriented as to form at least one metal wire having a longitudinal axis substantially aligned parallel with a second preferred crystal axis of the crystal structure of the material of the body;
   c. heating the body and the layer of metal to an elevated temperature for a predetermined period of time sufficient to sinter at least a portion of the layer of metal to a portion of the semiconductor material of the major surface of the body;
   d. heating the sintered body and the metal wire to a predetermined elevated temperature sufficient to form a melt of metal-rich semiconductor material on the surface of the body;
   e. establishing a temperature gradient substantially parallel to the vertical axis of the body and the first axis of the crystal structure; and
   f. migrating the melt of metal-rich semiconductor material through the solid body, substantially aligned with the first axis of the crystal structure, to a predetermined depth beneath that major surface to form a planar region of recrystallized material of the body having solid solubility of the metal therein.

2. The method of claim 1 including the additional process step prior to depositing the layer of metal on the surface of the body of
   forming a mask on the major surface having a preferred planar crystal orientation to define a preferred geometrical configuration for the layer of metal.

3. The method of claim 2 wherein the preferred planar crystal orientation is one selected from the group consisting of (111), (100) and (110).

4. The method of claim 3 wherein
   the semiconductor material of the body is one selected from the group consisting of silicon, silicon carbide, germanium and gallium arsenide.

5. The method of claim 4 wherein
   the semiconductor material is silicon having N-type conductivity, and
   the metal of the wire is aluminum.

6. The method of claim 4 wherein
   the temperature gradient is from 50° C to 200° C per centimeter, and
   the migration is practiced at a temperature of from 700° C to 1350° C.

7. The method of claim 4 wherein
   the preferred planar crystal orientation is (100),
   the first preferred crystal axis is $<100>$, and the second preferred crystal axis is at least one selected from the group consisting of < 011 > and < 0$\bar{1}$1 >.

8. The method of claim 4 wherein
the preferred planar crystal orientation is (111), and
the first preferred crystal axis is < 111 >.

9. The method of claim 3 including the additional process step after forming the mask and prior to depositing the layer of metal of:
etching selectively the major surface of the body to form at least one trough-like depression therein of a predetermined depth.

10. The method of claim 9 wherein
the semiconductor material of the body is one selected from the group consisting of silicon, silicon carbide, germanium and gallium arsenide.

11. The method of claim 10 wherein
the semiconductor material is silicon having N-type conductivity, and
the metal of the wire is aluminum.

12. The method of claim 10 wherein
the temperature gradient is from 50° C to 200° C per centimeter, and
the migration is practiced at a temperature of from 700° C to 1350° C.

13. The method of claim 10 wherein
the preferred planar crystal orientation is (100),
the first preferred crystal axis is < 100 >, and
the second preferred crystal axis is at least one selected from the group consisting of < 011 > and < 0$\bar{1}$1 >.

14. The method of claim 10 wherein
the preferred planar crystal orientation is (111), and
the first preferred crystal axis is < 111 >.

15. The method of claim 10 wherein
the major surface has a preferred planar crystal orientation of (110);
the first preferred crystal axis is < 110 >, and
the second preferred crystal axis is < 1$\bar{1}$0 >.

16. The method of claim 9 wherein
the preferred planar crystal orientation is (111), and
the geometrical configuration of the mask defines at least three lines, each line being oriented substantially parallel with a crystal axis which is substantially parallel with the (111) plane.

17. The method of claim 16 wherein
the semiconductor material of the body is one selected from the group consisting of silicon, silicon carbide, germanium and gallium arsenide.

18. The method of claim 17 wherein
the semiconductor material is silicon having N-type conductivity, and
the metal of the wire is aluminum.

19. The method of claim 16 wherein
the geometrical configuration defines a hexagon.

20. The method of claim 19 including the additional process step of
forming a planar region having two opposed major surfaces in the body and so oriented that the two opposed major surfaces are substantially parallel to the two major opposed surfaces of the body,
one of the opposed major surfaces of the planar region being contiguous and coextensive with one of the major opposed surfaces of the body, and
each melt is migrated a predetermined distance through the body to at least intersect the other major opposed surface of the planar region.

21. The method of claim 20 wherein each of the planar regions is of a second and opposite type conductivity than that of the body, and
the intersecting planar regions divide the body into a plurality of regions of semiconductor material of the same type conductivity as that of the body and each is electrically isolated from one another.

22. The method of claim 21 wherein
the semiconductor material is silicon of N-type conductivity,
the planar regions are each of P-type conductivity, and
the metal of the layer is aluminum.

23. The method of claim 3 wherein
the preferred geometrical configuration defines at least two intersecting lines, one line being oriented substantially parallel with the first preferred crystal axis, and
the second line being oriented substantially parallel with a third preferred crystal axis of the material of the body.

24. The method of claim 23 wherein
the semiconductor material of the body is one selected from the group consisting of silicon, silicon carbide, germanium and gallium arsenide.

25. The method of claim 24 wherein
the semiconductor material is silicon having N-type conductivity, and
the metal of the wire is aluminum.

26. The method of claim 24 wherein
the temperature gradient is from 50° C to 200° C per centimeter, and
the migration is practiced at a temperature of from 700° C to 1350° C.

27. The method of claim 24 wherein
the preferred planar crystal orientation is (100),
the first preferred crystal axis is < 100 >, and
the second preferred crystal axis is < 011 >, and
the third preferred crystal axis is < 0$\bar{1}$1 >.

28. The method of claim 24 wherein
the preferred planar crystal orientation is (111),
the first preferred crystal axis is < 111 >,
the second preferred crystal axis is any crystal axis substantially parallel with the (111) plane, and
the third preferred crystal axis is any remaining crystal axis substantially parallel with the (111) plane.

29. The method of claim 24 wherein
the preferred planar crystal orientation is (111),
the first preferred crystal axis is < 111 >,
the second preferred crystal axis is one selected from the group consisting of < 0$\bar{1}$1 >, < 10$\bar{1}$ > and < 1$\bar{1}$0 >, and
the third preferred crystal axis is any of the remaining axes substantially parallel with the (111) plane.

30. The method of claim 24 wherein
the preferred crystal orientation is (111),
the first preferred crystal axis is < 111 >,
the second preferred crystal axis is one selected from the group consisting of < 11$\bar{2}$ >, < $\bar{2}$11 > and < 1$\bar{2}$1 >, and
the third preferred crystal axis is any of the remaining axes substantially parallel with the (111) plane.

31. The method of claim 1 including the additional process step of
forming a planar region having two opposed major surfaces in the body and so oriented that the two opposed major surfaces are substantially parallel to the two major opposed surfaces of the body;

one of the opposed major surfaces of the planar region being contiguous and coextensive with one of the major opposed surfaces of the body, and each melt is migrated a predetermined distance through the body to at least intersect the other major opposed surface of the planar region.

32. The method of claim 31 wherein each of the planar regions is of a second and opposite type conductivity than that of the body, and the intersecting planar regions divide the body into a plurality of regions of semiconductor material of the same type conductivity as that of the body and each is electrically isolated from one another.

33. The method of claim 32 wherein the semiconductor material is silicon of N-type conductivity, the planar regions are each of P-type conductivity, and the metal of the layer is aluminum.

* * * * *